(12) United States Patent
Leong

(10) Patent No.: US 6,211,687 B1
(45) Date of Patent: Apr. 3, 2001

(54) CONNECTOR CONTACT FINGERS FOR TESTING INTEGRATED CIRCUIT PACKAGES

(76) Inventor: Tan Yin Leong, Block 22 St. George's Road, #25-182, Singapore 321022 (SG)

( * ) Notice: Subject to any disclaimer, the term of this patent is extended or adjusted under 35 U.S.C. 154(b) by 0 days.

(21) Appl. No.: 08/963,783

(22) Filed: Nov. 4, 1997

(30) Foreign Application Priority Data

Dec. 2, 1996 (SG) ................................. 9611495

(51) Int. Cl.[7] .................. H01H 31/04; G01R 31/02; H01R 13/62
(52) U.S. Cl. .................. 324/754; 324/538; 439/153; 439/155
(58) Field of Search .................. 324/756, 761, 324/762, 754, 538, 537; 439/55, 59, 152, 153, 155

(56) References Cited

U.S. PATENT DOCUMENTS

| | | | |
|---|---|---|---|
| 3,805,159 | * | 4/1974 | Richelmann ................. 324/761 |
| 4,531,792 | * | 7/1985 | Oshitami et al. ............. 439/70 |
| 5,033,977 | * | 7/1991 | Ignasiak ..................... 324/754 |
| 5,152,697 | * | 10/1992 | Abe et al. .................. 439/152 |
| 5,156,649 | * | 10/1992 | Compton et al. ............. 324/762 |
| 5,221,895 | * | 6/1993 | Janko et al. ................ 324/762 |
| 5,355,080 | * | 10/1994 | Sato et al. ................. 324/761 |
| 5,463,324 | * | 10/1995 | Wardell et al. .............. 324/754 |
| 5,502,396 | * | 3/1996 | Desarzens et al. ............ 324/756 |
| 5,720,098 | * | 2/1998 | Kister ...................... 324/761 |

* cited by examiner

*Primary Examiner*—Safet Metjahic
*Assistant Examiner*—Jermele Hollington
(74) *Attorney, Agent, or Firm*—Lawrence Y.D. Ho; David D. Chung

(57) ABSTRACT

A connector contact fingers of a testing rig which overcomes the co-planarity, contact and alignment difficulties in the testing procedure of integrated circuit packages. The connector comprises a tongue extension to the ends of the fingers to increase the surface area from which contact can be made with the device lead, a lever extension to the retainer along one side of the fingers to prevent deflection of the fingers, and a shoulder structure in the connector which acts as an adaptor to secure a flexible printed circuit board to the legs.

18 Claims, 9 Drawing Sheets

CONNECTOR CONTACT FINGERS FOR TESTING INTEGRATED CIRCUIT PACKAGES

FIELD OF INVENTION

This invention relates to a connector contact fingers of a testing rig (304) used in testing integrated circuit packages in the semi-conductor industry.

BACKGROUND OF THE INVENTION

Connector contact fingers are used in test rigs in the semi-conductor industry to test integrated circuit (IC) packages. A typical connector, as shown in FIGS. 1 and 6, comprises a retainer wherein a plurality of parallel metallic strips are mounted. The retainer (103), is a rectangular block typically made from non-conducting material such as moulded plastic wherein one longitudinal edge has been moulded into a rectangular-shaped recess (reference numeral 104 of FIG. 6). The metallic strips are embedded in the retainer, such that the two ends of the strips are exposed and available for electrical connections. One end of the strips (101), protrudes out from the retainer, and is known as the fingers end, with each exposed strip representing one finger. The second end of the metal strips (102), protrudes across but within the recess, and is known as the leg end, with each exposed strip from the second end representing one leg. Small outline surface-mount packaging for integrated circuits (SOIC's) is a widely used basic package-mounting technique in the semi-conductor industry.

An example is the SOP (small outline packages) having leads that protrude out from the packaging in a gull-wing formation (reference numeral 203 of FIG. 2). The gull-wing lead of an SOIC package consists of a flat wing-tip section (201), and a bent wing-centre section (202). A typical instrument for testing the aforementioned IC packages is called a testing rig, wherein the connector contact fingers is mounted onto the contactor assembly. The contactor assembly, as shown in FIG. 3, comprises a main track in the centre (reference numeral 301) whereon the IC device to be tested would be transferred A pair of connectors are installed on the right side of the main track (303), and a second pair on the left side (302) of the main track. Each pair of connectors consists of one top connector in the inverted position, and one bottom connector in the upright position. Installation of the connectors involves first positioning an IC package (203) onto the designated position on the main track between the two pairs of connectors as shown in FIG. 4. Then the position of each connector is adjusted whereby each finger is aligned with the corresponding lead. Once precise alignment is achieved, devices to be tested are transferred sequentially through the main track. When the device to be tested stops at the designated position on the main track, the two pairs of connectors act like two pairs of pincers, and clamp onto the corresponding leads of the device. Once connection is made, current will flow through the device, and the function of the device can be tested. If the pre-set current level is measured, the device is accepted, if the pre-current level is not detected, the device is rejected as defective.

Precise alignment involves adjustment in the X position in the direction of the device flow (as shown by the double-headed arrow of reference numeral 401), and the Y position at 90° to the device flow (402) as shown in FIG. 4. Movement in the Z position vertically (reference numeral 502 of FIG. 5) is used to achieve the clamping function. The correct alignment in the X-direction would result in the lead (201) being located at the centre of both the top and bottom (101) fingers as shown in reference numeral 404 of FIGS. 4B and 4D. An incorrect alignment in the direction would cause the lead to be located off to one side of the top or the bottom fingers, resulting in poor contact, as shown in 403 of FIGS. 4A and 4C. Correct alignment in the Y-direction (502) would allow the fingers to clamp at the central portion of the wing-tip of the lead, giving good contact as shown in 501 of FIG. 5A. Incorrect alignment in the Y-direction by positioning the connector too close to the main track results in the fingers clamping onto the wing-centre, causing poor contact and damage to the lead, as shown in 503 of FIG. 5B. Conversely, positioning the connector too far away from the main track results in the fingers clamping the lead toward the tip of the gull-wing, again causing poor contact.

The leg area of the connector comprises a plurality of parallel legs protruding across but within the recess of the retainer. The space between the legs and the retainer, as shown in reference numeral 104 of FIGS. 6 and 6A, functions as a socket wherein the card edge (601) of a flexible printed circuit board (602) can be inserted. Once the flexible printed circuit board is properly connected and the connectors are precisely aligned, testing of the devices may commence.

Although the aforementioned method is widely accepted for testing IC devices, it has several problems that render the process inefficient and difficult. The first problem is that the area of contact between the fingers and the device lead is extremely small. As each finger converges onto the lead at an angled finger tip as shown in reference numeral 204 of FIG. 2, the line of contact is essentially the edge of the metal strip of the finger. If the lead is not precisely aligned as described above, poor contact and faulty connection would result, giving faulty readings. As a result, precise alignment by a skilled technician is required every time a connector is changed. This alignment procedure is tedious and time-consuming.

Another difficulty is encountered when force is applied in the Z-direction to raise the lower connectors in order to clamp the device leads between the top and bottom fingers. Finding the appropriate contact pressure is very important in ensuring long life to the contact leads and fingers. Too much force would cause excessive flexing and the result is broken or bent contact leads or fingers. Too little force might result in faulty connection at the lines of contact. Even when the correct pressure is used, extended usage results in a co-planarity problem whereby one or more fingers within the same connector become bent or flexed. In this instance, the bent fingers would not be lying on the same plane as the other fingers of the same connector. As a result, the bent fingers cannot establish contact with the corresponding device leads. If misalignment or co-planarity problems occur, a device which would have passed the test if proper connections were made, may actually be rejected due to faulty readings caused by poor contacts. This raises the rejection rate in the quality control process, and is very costly to the industry.

Contact between the flexible printed circuit board and the legs of the connector is also problematic. As shown in FIG. 6, there is no special design in the art whereby the card edge of the flexible printed circuit board can be secured onto the connector. Proper connection is dependent on the spring force exerted by the legs on the card edge. The connector is shifted along the Z axis to clamp each new IC device as each device is being tested. Such shifting movement could cause the card edge to come loose from the recess of the connector, resulting in poor contact with the legs. In addition, a vertical movement could cause the flexible printed circuit board to tilt and impinge upon the legs, deflecting some or all the legs out of their normal position, resulting in further co-planarity problem at the leg end or a loss of spring force. The consequence of the above problems is that as one increases the number of tests conducted using the same set of connectors, the rejection rate also increases due to poor contact. Limiting the number of tests conducted for each set of connectors would improve the fidelity of the tests. However this is not taught in the art, as each change of connectors requires time-consuming re-alignment, slowing down the quality control process.

OBJECT OF THE INVENTION

It is an object of this invention to overcome the co-planarity, contact and alignment problems in the connector.

It is another object of this invention to increase the life-span of the connector.

It is yet another object of this invention to reduce the time required for re-alignment of newly installed connectors.

It is a further object of this invention to increase the overall efficiency and fidelity of the testing procedure for SOIC packages.

SUMMARY OF THE INVENTION

The present invention seeks to improve the efficiency for testing SOIC packages. The invention resides in a connector, which comprises a tongue extension to the ends of the fingers to increase the surface area from which contact can be made with the device lead, a lever extension to the retainer along one side of the fingers to prevent deflection of the fingers, and a shoulder projecting out from each of the two ends of the recess which acts as an adaptor to secure the card edge of the flexible printed circuit board to the legs. The extension tongue also gives the added advantage of improved visibility, wherein the technician performing the testing can have a much better view in the alignment process. As a result, the time required to precisely align each new set of the present connectors can be substantially reduced. The lever solves the co-planarity problem that has plagued the testing process. Consequently, the connectors have a longer lifespan with lower rejection rates. The overall result of the present invention is to increase the output of the testing procedure while lowering the rejection rate of tested SOIC's.

DESCRIPTION OF THE EMBODIMENT OF THE INVENTION

While the features of this invention are herein illustrated and described as being particularly adapted to the testing process for the gull-wing SOIC packaging, it is to be understood that the various features of this invention can be incorporated singly or in any combination thereof to improve the testing procedure of other IC packages.

Figure 1:
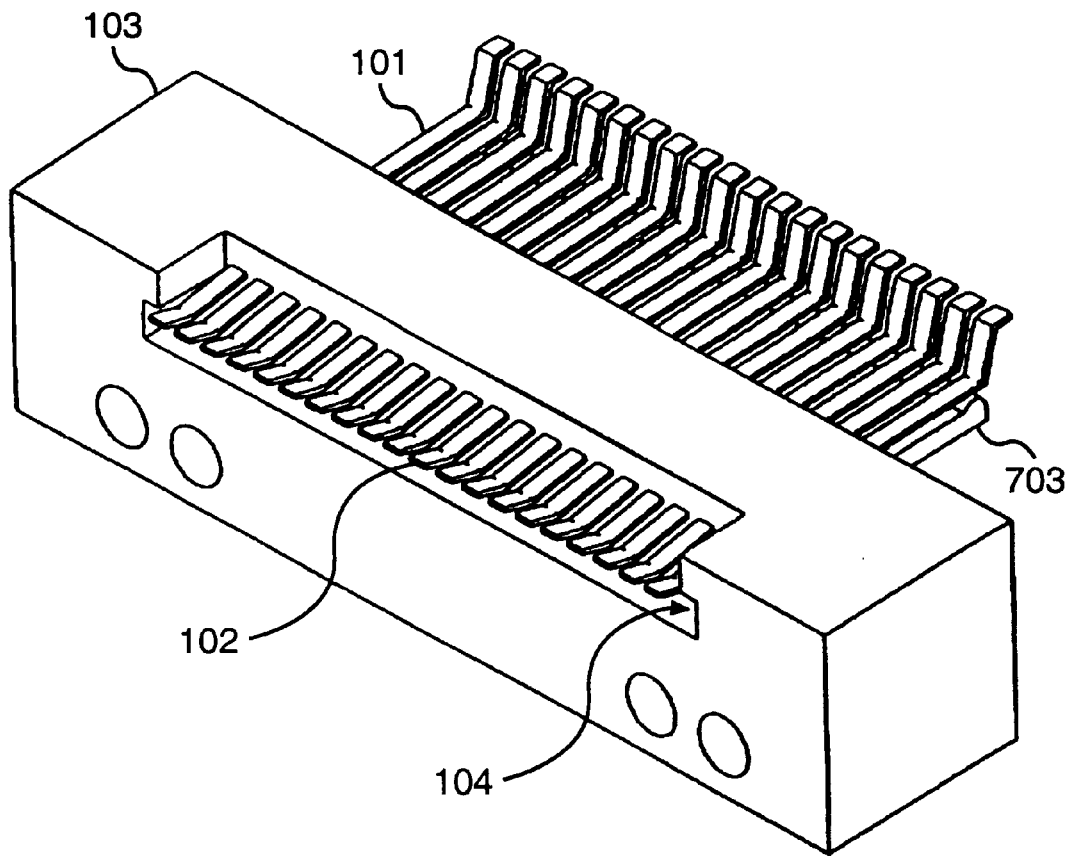
FIG. 1 is a connector contact fingers in the prior art.
Figure 2:
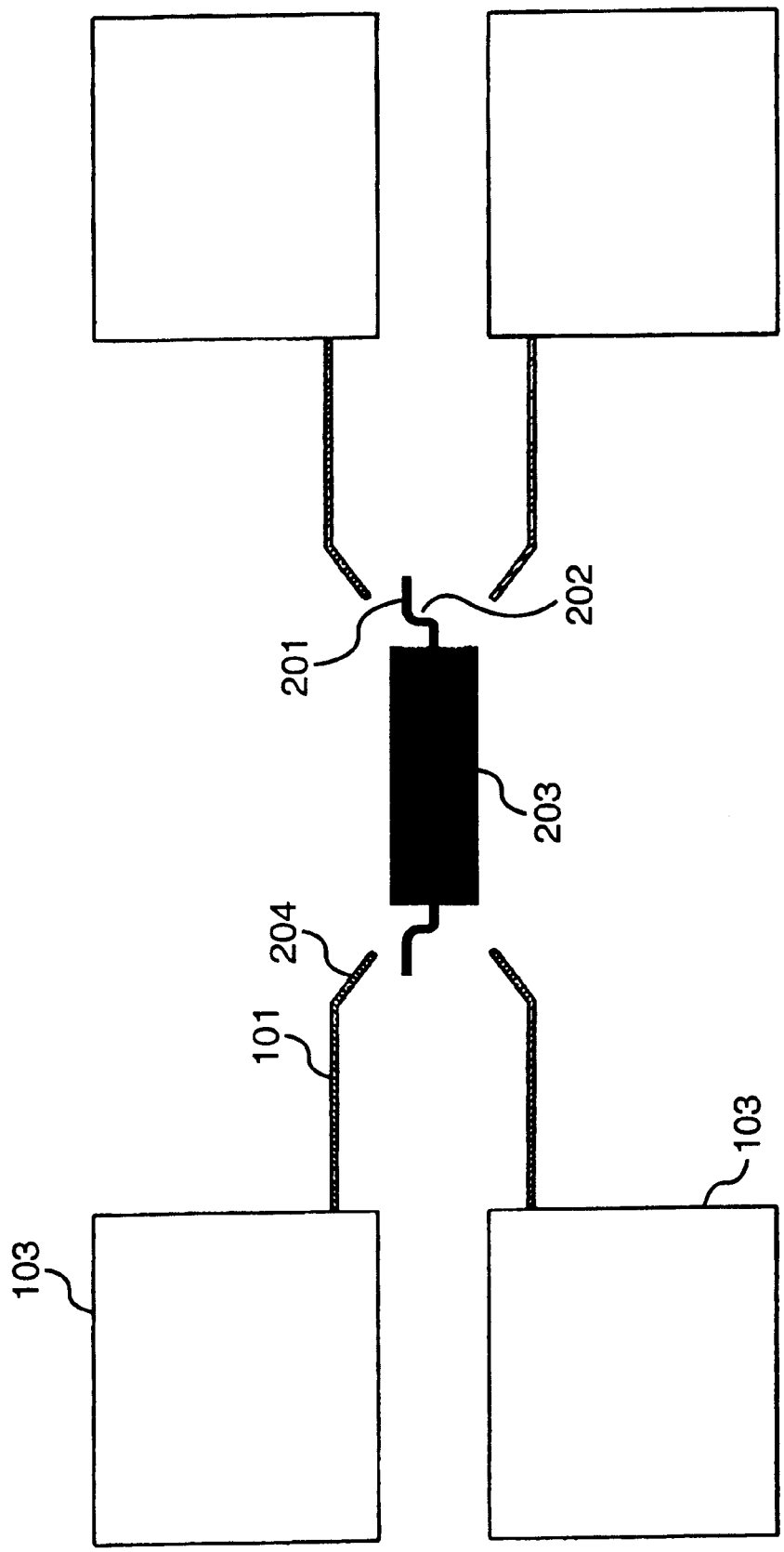
FIG. 2 is a cross-sectional view of a standard IC device testing configuration using connector contact fingers known in the art.
Figure 3:
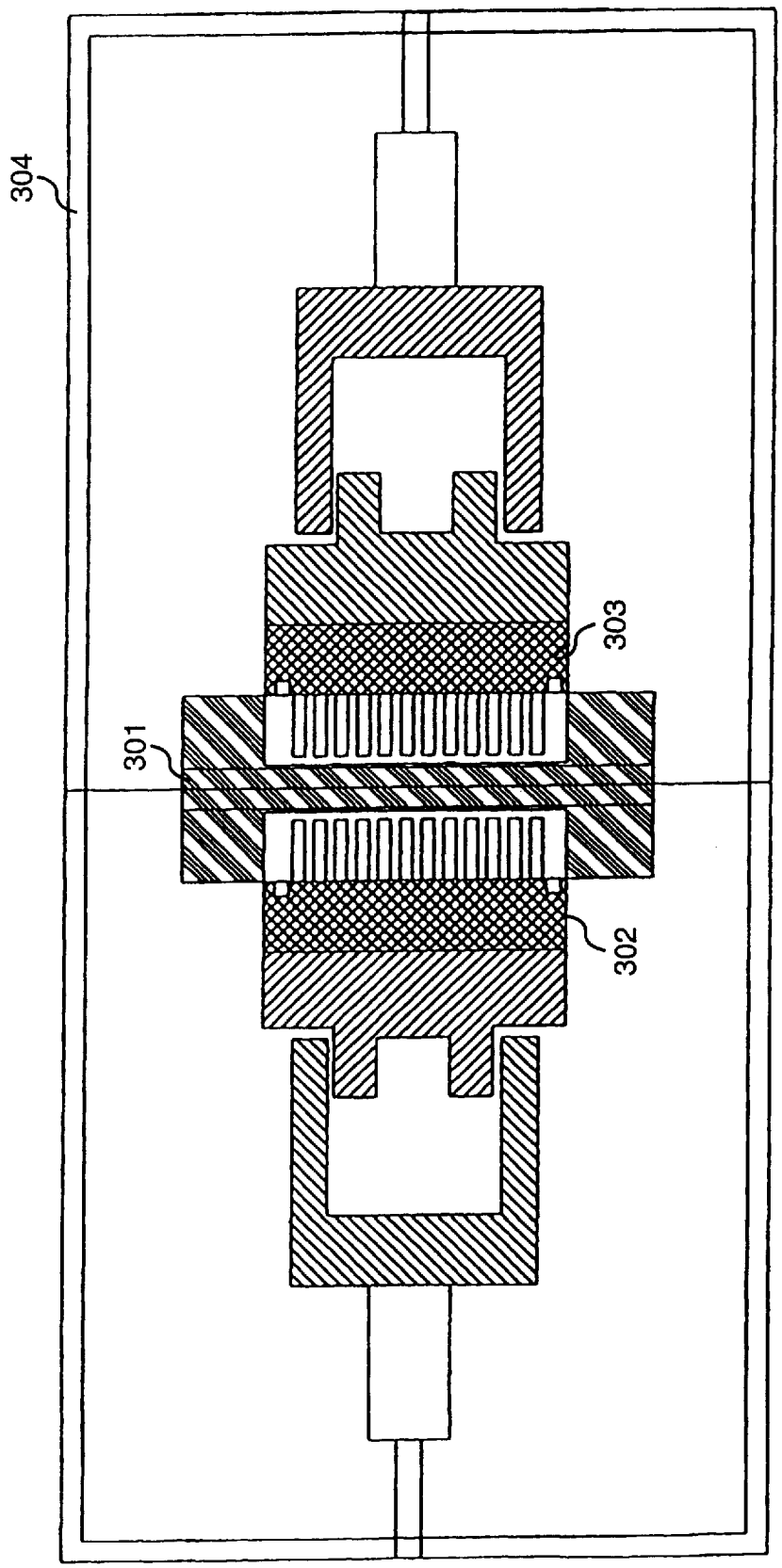
FIG. 3 is a simplified drawing of a top view of a Contactor Assembly.
Figure 4D:
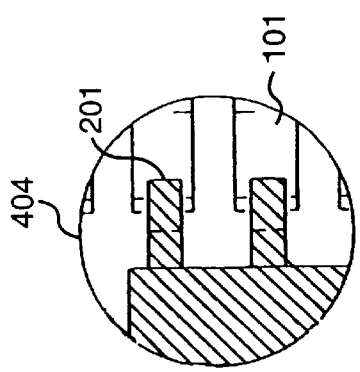
FIGS. 4C and 4D are enlarged views of areas 403 and 404 respectively.
Figure 4B:
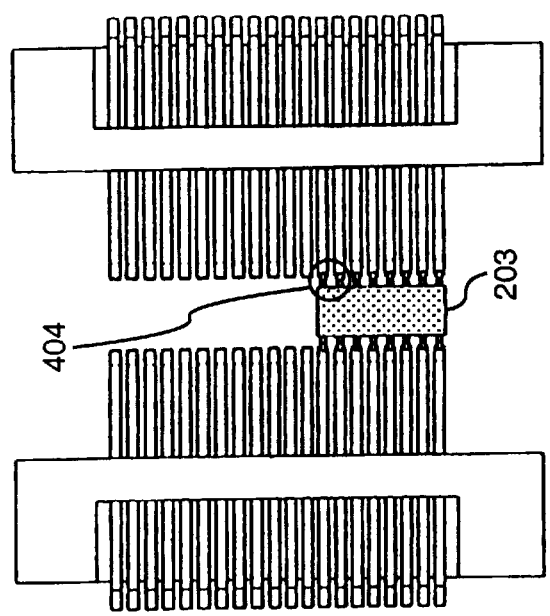
FIGS. 4A and 4B are top views of a connector contact fingers improperly (FIG. 4A) and properly (FIG. 4B) aligned with an IC device.
Figure 4C:
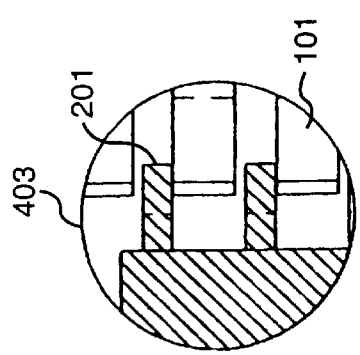
Figure 4A:
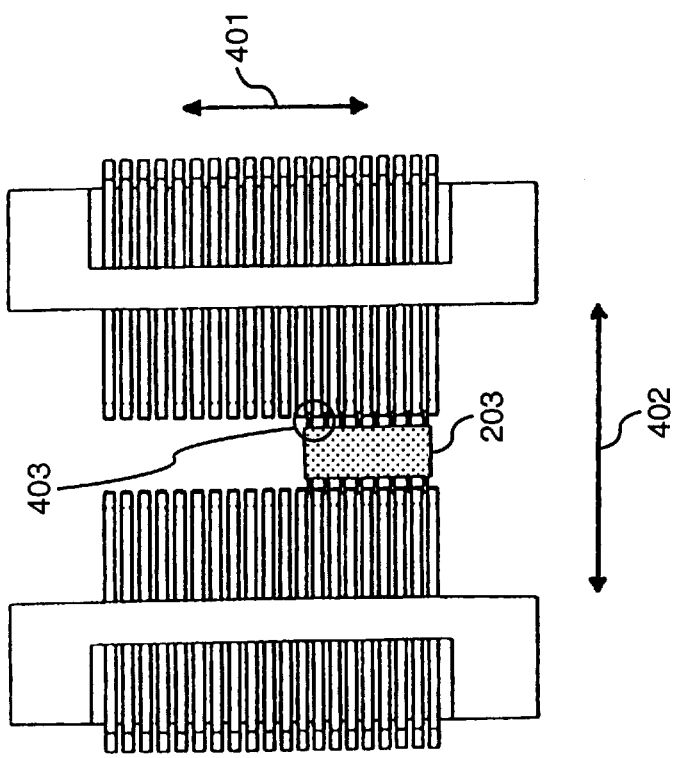
Figure 5B:
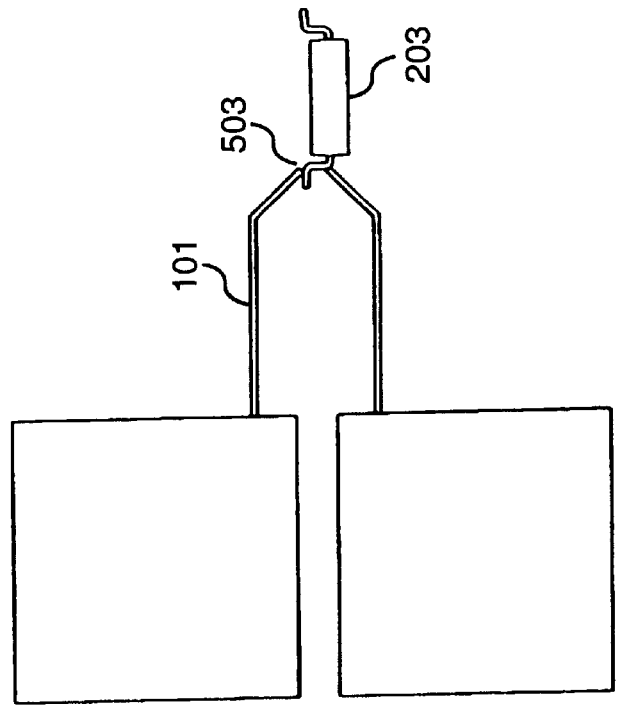
FIG. 5 is a side view of a connector contact fingers alignment with IC device.
Figure 5A:
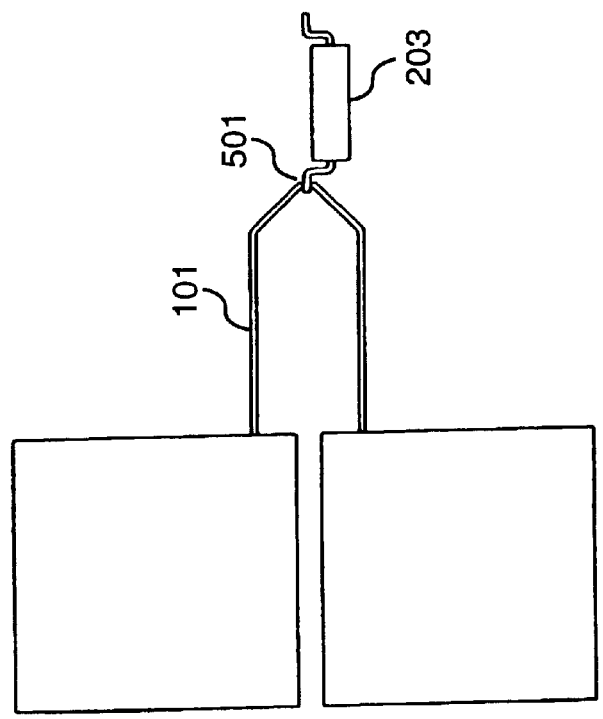
Figure 6:
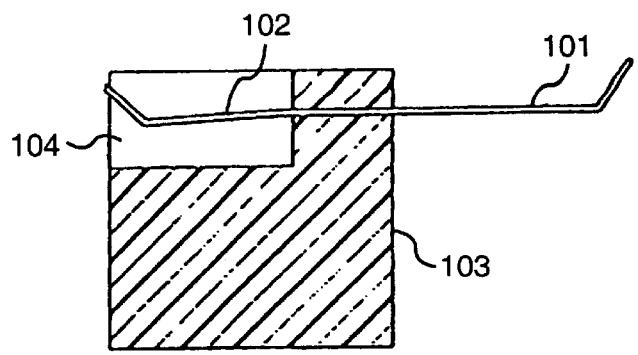
FIG. 6 is a cross-sectional view of a connector contact fingers in the prior art.
Figure 6A:
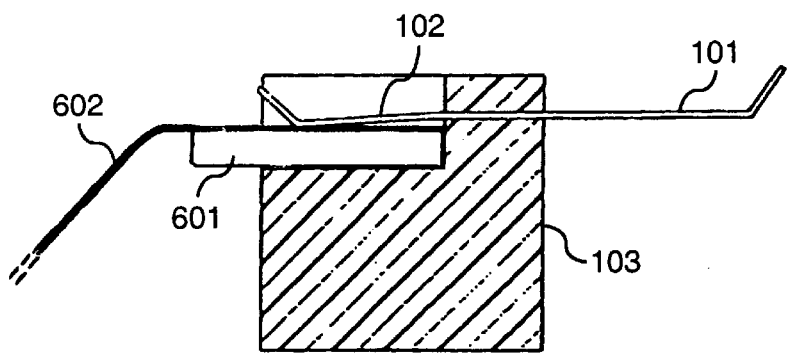
FIG. 6A is the cross-sectional view of the same connector contact fingers as in FIG. 6, but with the card edge of the flexible printed circuit board inserted.
Figure 7:
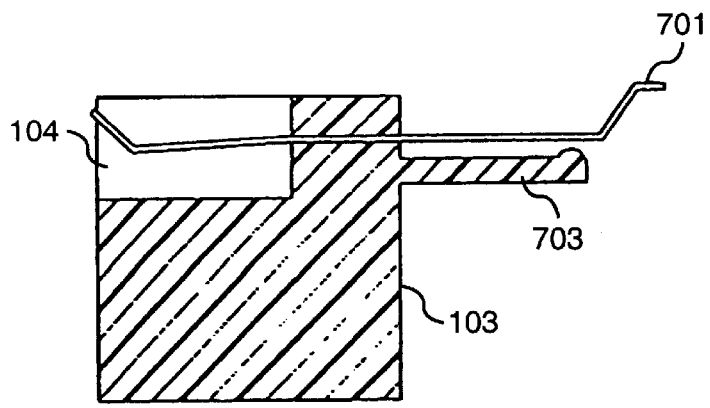
FIG. 7 is a cross-sectional view of a connector contact fingers which is an embodiment of this invention.
Figure 7A:
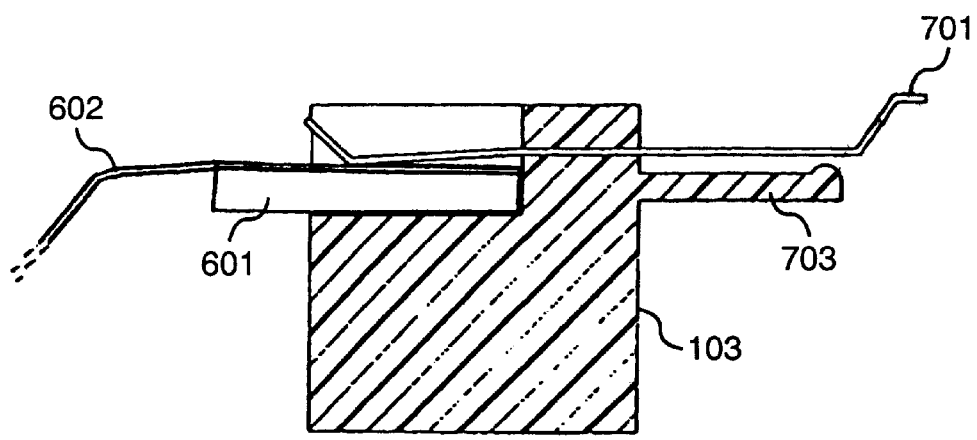
FIG. 7A is the cross-sectional view of the same connector contact fingers as in FIG. 7, but with the card edge of the flexible printed circuit board inserted.
Figure 8:
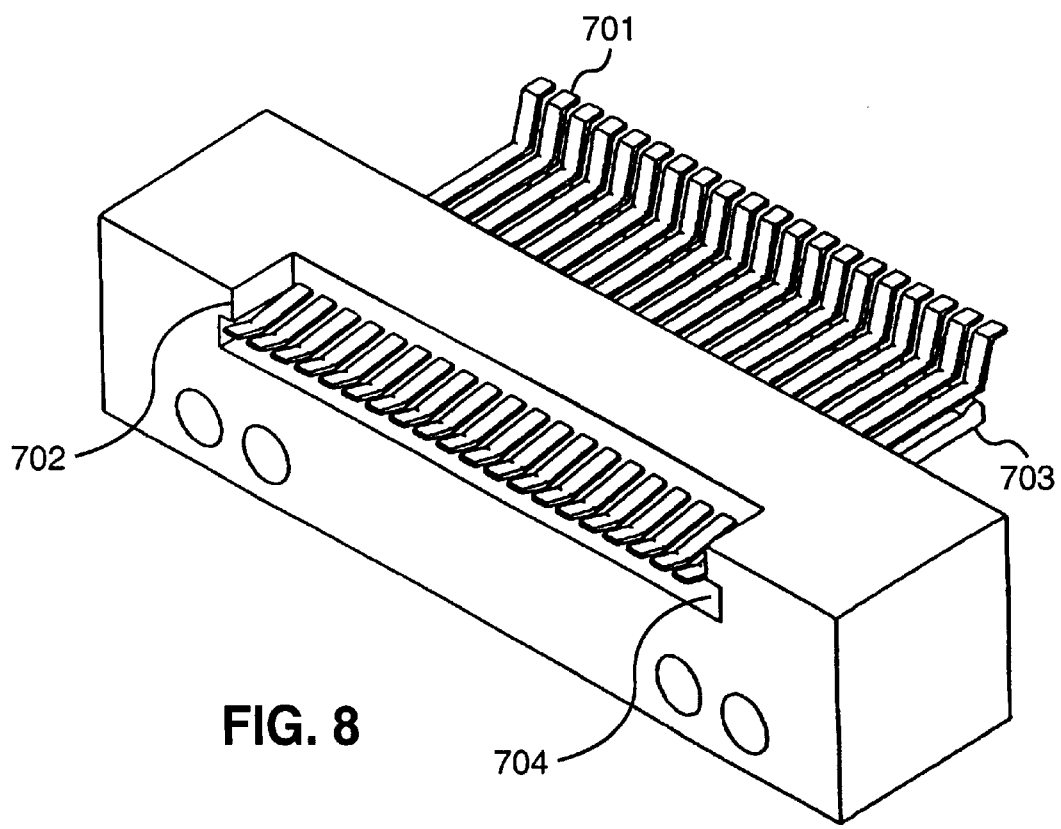
FIG. 8 is a connector contact fingers which is an embodiment of this invention.
Figure 9:
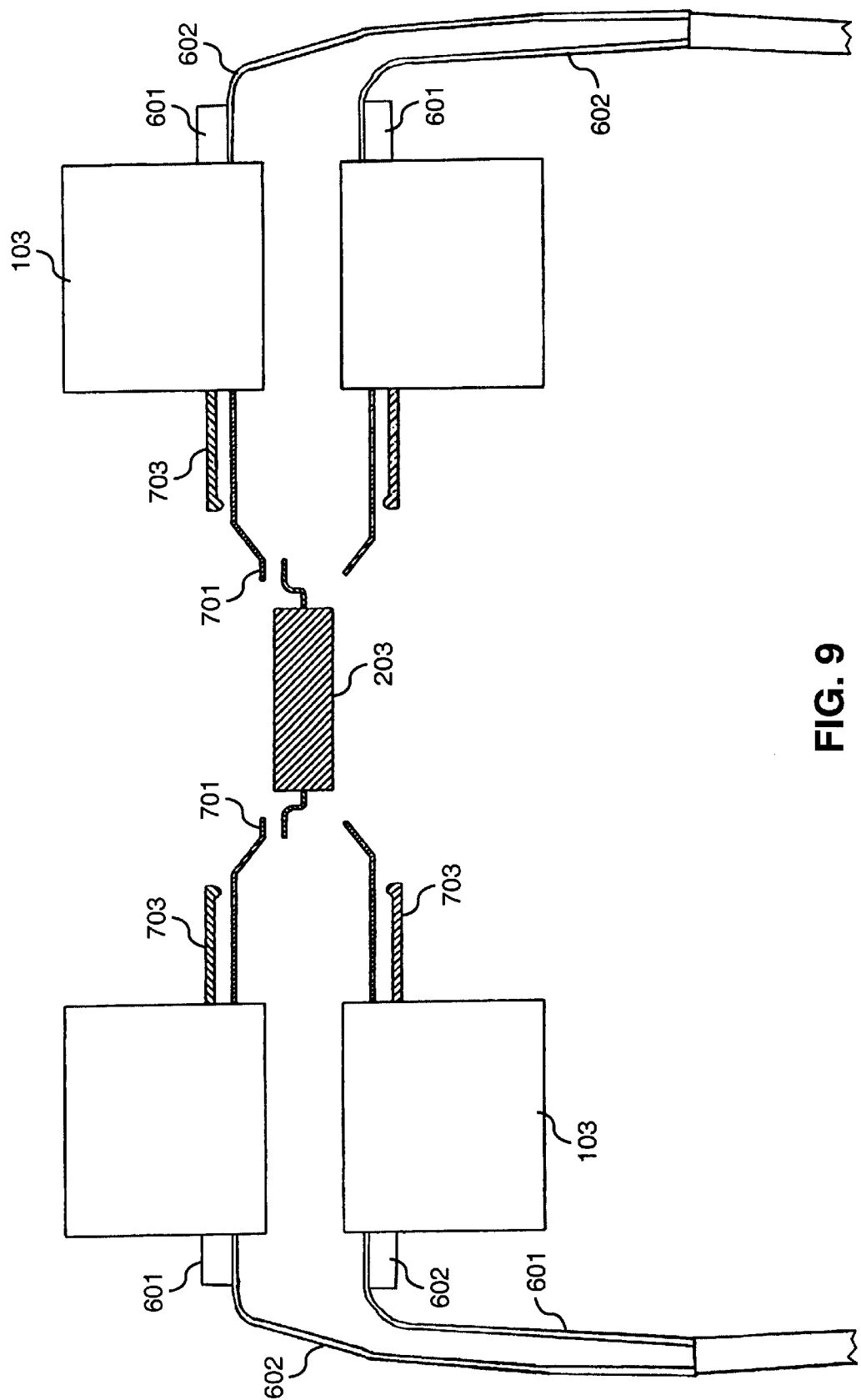
FIG. 9 is a cross-sectional view of the configuration for IC device testing using the connectors in the present invention.

As stated previously, it is one object of this invention to overcome the alignment and contact problems at the finger end of the connector by introducing a novel tongue extension to the fingers, as shown by reference numerals 701 in FIGS. 7 and 8 respectively. The tongue in its simplest form is an additional bend at the finger tip, whereby a planar surface is created. A connector which features the aforementioned tongue is known as the Bigfoot. When the Bigfoot connector is installed into the contactor assembly, the tongue would run parallel to the lead of the IC device to be tested. FIG. 9 shows the preferred configuration between the Bigfoot connectors and the IC device to be tested. From FIG. 9, the benefits of the tongue feature (701) becomes immediately apparent. The plane of the tongue has created a large surface area wherefrom contact can be made with the IC device. As a result, instead of relying on a line of contact between the edge of the fingers and the lead, contact with a bigfoot connector involves a plane containing the entire area of the tongue. Therefore, even if the fingers contain small defects or sustained minor distortions and deflections, the bigfoot design provides sufficient contact with the lead to allow a proper test to be conducted.

The requirement for precise alignment is less stringent when the bigfoot design is used due to this larger surface area, yet fidelity of the testing process is improved. Another benefit of the bigfoot design is that the additional area created by the tongue feature gives the technician a better view of the fingers in relationship to the lead. Together with the fact that alignment requirements are less stringent, the alignment process is made easier and faster. As a result, the testing process is faster yet fewer devices are rejected due to poor contact or poor alignment. The dimensions of the tongue would be based on the dimension of the gull wing device. The length of the tongue should be sufficiently long for good contact to be established with the device lead without the tongue being so long as to interfere with the movement of the device on the main track during the testing process. For testing SOIC packages, the preferred length of the tongue would be approximately the same as the length of the wing-tip section of the gull-wing.

To improve contact with the flexible printed circuit board at the leg end, an adaptor has been designed to secure the flexible printed circuit board to the substrate to give good contact with the legs as shown in FIG. 8. The adaptor comprises a shoulder extension (702) at each of the two ends of the recess in the retainer, each shoulder creating a slot (704) wherein the card edge (601) of the flexible printed circuit board (602) is to be inserted. The height of the slot should be approximately the same thickness as the card edge of the flexible printed circuit board. This slot height allows the card edge to be inserted comfortably yet tightly, whereby the shoulders prevent the card edge from tilting in any direction while allowing proper connections with the legs to be made. As a result, the legs are protected by the shoulders from being distorted by any tilting movements of the card edge.

The two design modifications described above solve the contact problems at both the leg end and the finger end The adaptor design has the further advantage of alleviating the co-planarity problem found at the leg end. However, they do not address the co-planarity problem caused by the clamping process at the finger end. As mentioned previously, while pressure is applied to raise the bottom connector to clamp the lead between the fingers, flexing and bending of the fingers may result. Consequently, co-planarity problem starts to occur, especially with repeated tests. The present invention has overcome this problem by introducing a non-conducting support behind the fingers such that excessive deflection would not be experienced even with repeated tests. The support can be in the form of a lever extension of the retainer as illustrated by reference numerals 703 of FIGS. 7, 7A, 8 and 9. In these drawings, the support is a lever extension of the moulded plastic retainer. The space between the lever and the fingers constitutes the maximum distance that any finger could be deflected, even after repeated rounds of testing with the IC devices. This maximum distance of deflection depends on the material used for the fingers and the length of the fingers, and this distance should be small enough to prevent distortion and co-planarity problems of the fingers. A preferred distance is 0.5–1 mm With this lever, fidelity of the tests remain high, while the lifespan of each connector is extended, without the concomitant rise in the rejection rate.

Figure 10:
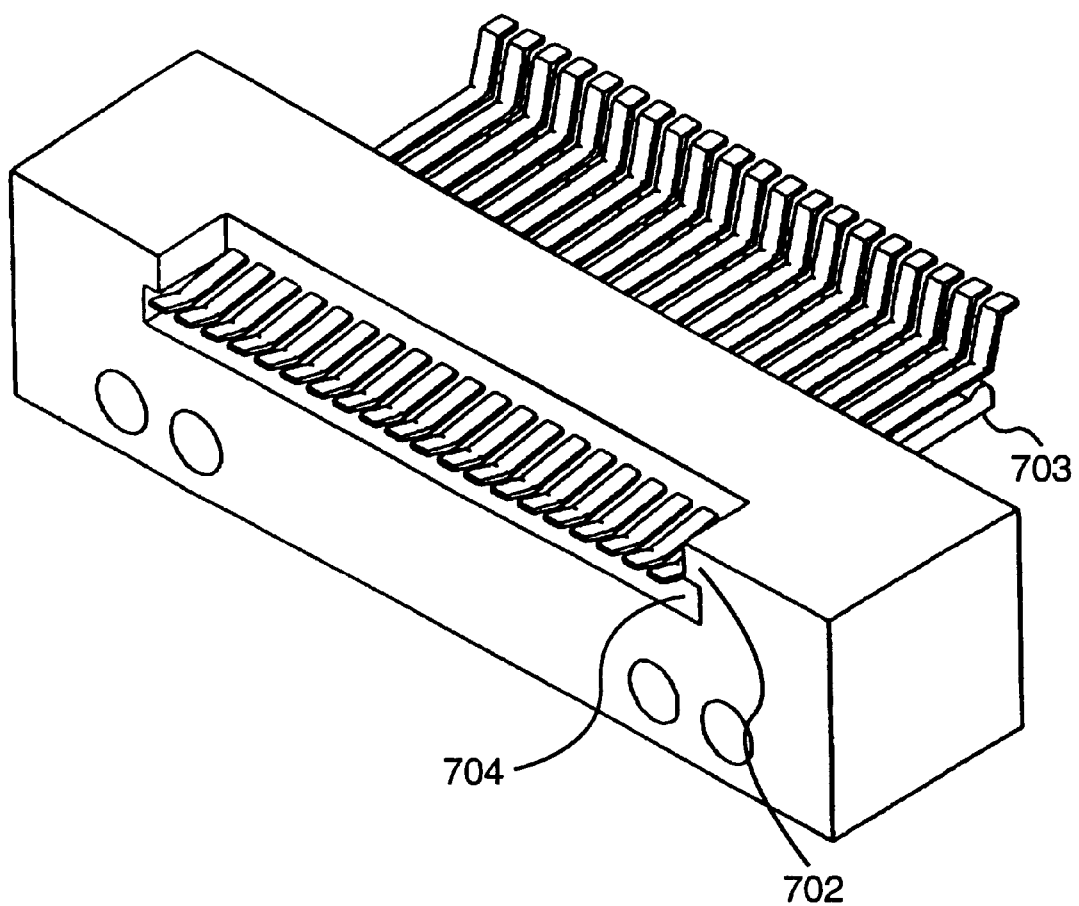
FIG. 10 a connector contact fingers which is another embodiment of this invention.

If the device is a gull wing SOIC package, the preferred embodiment is to have the tongue feature in the two top connectors, while the two bottom ones would not have the tongue feature, as illustrated in FIG. 9. This is because the tongue feature in the bottom connectors might damage the device leads if not aligned properly. Therefore, the preferred configuration of the bottom connectors is to have the lever and the adaptor features, without the tongue feature, as shown in FIG. 10.

What is claimed is:

1. A connector for facilitating the testing of integrated circuit packages comprising:
    (a) a retainer for connecting said connector to a testing rig, said retainer having a recess disposed lengthwise for facilitating connection with said test rig, and
    (b) a plurality of parallel conducting strips, each said conducting strip being embedded across said retainer such that one end protrudes as a leg across but within said recess, said leg adapted for electrical connection to said test rig, and the other end protrudes out as a finger from said retainer, each said finger further terminating at an angled finger tip, having a proximal portion proximal said retainer and a distal portion extending therefrom, said distal portion further bent to form an angle such that the distal end points towards a first side, said tip further having a flat tongue portion with a planar surface and adapted for electrical contact with a lead of said integrated circuit package.

2. A connector as in claim 1 wherein said retainer comprises non-conducting material.

3. A connector as in claim 1 wherein said parallel conducting strips comprises metallic material.

4. A connector for facilitating the testing of integrated circuit packages comprising:
    (a) a retainer for connecting said connector to a testing rig, said retainer having a recess disposed lengthwise for facilitating connection with said test rig,
    (b) a plurality of parallel conducting strips, each said conducting strip being embedded across said retainer such that one end protrudes as a leg across but within said recess, said leg adapted for electrical connection to said test rig, and the other end protrudes out at a finger from said retainer, said finger adapted for electrical contact with a lead of said integrated circuit package; and
    (c) a shoulder overhanging from each of the two ends of said recess of said retainer to define a slot, said slot indented within said shoulder wherein a card edge of a flexible printed circuit board may be inserted laterally within said slot and between said legs and said retainer, the height said slot being substantially the same as the thickness of the card end such that said card edge is prevented from causing deflection of said legs.

5. A connector as in claim 4 wherein said retainer comprises non-conducting material.

6. A connector as in claim 4 wherein said parallel conducting strips comprises metallic material.

7. A connector for facilitating the testing of integrated circuit packages comprising:
    (a) a retainer for connecting said connector to a testing rig, said retainer having a recess disposed lengthwise for facilitating connection with said test rig,
    (b) a plurality of parallel conducting strips, each said conducting strip being embedded across said retainer such that one end protrudes as a leg across but within said recess, said leg adapted for electrical connection to said test rig, and the other end protrudes out as a finger from said retainer, each said finger having a proximal portion proximal said retainer and a distal portion extending therefrom, said distal portion further bent to form an angle such that the distal end points towards a first side, said tip of said finger further adapted for electrical contact with a lead of said integrated circuit package; and
    (c) a substantially immovable lever projecting out from said retainer along the length of the fingers adjacent a second side opposite said first side, said lever positioned to stop said fingers from deflecting towards said second side when said tip of said finger come into contact with said leads of said integrated circuit package.

8. A connector as in claim 7 wherein said retainer comprises non-conducting material.

9. A connector as in claim 7 wherein said parallel conducting strips comprises metallic material.

10. A connector for facilitating the testing of integrated circuit packages comprising:
    (a) a retainer for connecting said connector to a testing rig, said retainer having a recess disposed lengthwise for facilitating connection with said test rig, and
    (b) a plurality of parallel conducting strips, each said conducting strip being embedded across said retainer such that one end protrudes as a leg across but within said recess, said leg adapted for electrical connection to said test rig, and the other end protrudes out as a finger from said retainer, each said finger further terminating at an angled finger tip, said tip further having a flat tongue portion with a planar surface for electrical contact with said lead of an integrated circuit package; and (c) a shoulder overhanging from each of the two ends of said recess of said retainer to define a slot, said slot indented within said shoulder wherein a card edge of a flexible printed circuit board may be inserted laterally within said slot and between said legs and said retainer, the height said slot being substantially the same as the thickness of the card end such that said card edge is prevented from causing deflection of said legs.

11. A connector as in claim 10 wherein said retainer comprises non-conducting material.

12. A connector as in claim 10 wherein said parallel conducting strips comprises metallic material.

13. A connector for facilitating the testing of integrated circuit packages comprising:

(a) a retainer for connecting said connector to a testing rig, said retainer having a recess disposed lengthwise for facilitating connection with said test rig, (b) a plurality of parallel conducting strips, each said conducting strip being embedded across said retainer such that one end protrudes as a leg across but within said recess, said leg adapted for electrical connection to said test rig, and the other end protrudes out at a finger from said retainer, said finger adapted for electrical contact with a lead of said integrated circuit package;

(c) a shoulder overhanging from each of the two ends of said recess of said retainer to define a slot, said slot indented within said shoulder wherein a card edge of a flexible printed circuit board may be inserted laterally within said slot and between said legs and said retainer, the height said slot being substantially the same as the thickness of the card end such that said card edge is prevented from causing deflection of said legs; and (d) a substantially immovable lever projecting out from said retainer along the length of the fingers, said lever positioned to stop said fingers from deflecting away from said leads upon contact with said leads of said integrated circuit package.

14. A connector as in claim 13 wherein said retainer comprises non-conducting material.

15. A connector as in claim 13 wherein said parallel conducting strips comprises metallic material.

16. A connector for facilitating the testing of integrated circuit packages comprising:

(a) a retainer for connecting said connector to a testing rig, said retainer having a recess disposed lengthwise for facilitating connection with said test rig, and (b) a plurality of parallel conducting strips, each said conducting strip being embedded across said retainer such that one end protrudes as a leg across but within said recess, said leg adapted for electrical connection to said test rig, and the other end protrudes out as a finger from said retainer, each said finger further terminating at an angled finger tip, said tip further having a flat tongue portion with a planar surface for electrical contact with a lead of said integrated circuit package;

(c) a substantially immovable lever projecting out from said retainer along the length of the fingers, said lever positioned to stop said fingers from deflecting away from said leads upon contact with said leads of said integrated circuit package; and (d) a shoulder overhanging from each of the two ends of said recess of said retainer to define a slot, said slot indented within said shoulder wherein a card edge of a flexible printed circuit board may be inserted laterally within said slot and between said legs and said retainer, the height said slot being substantially the same as the thickness of the card end such that said card edge is prevented from causing deflection of said legs.

17. A connector as in claim 16 wherein said retainer comprises non-conducting material.

18. A connector as in claim 16 wherein said parallel conducting strips comprises metallic material.

\* \* \* \* \*